United States Patent [19]

Scifres et al.

[11] Patent Number: 4,594,718
[45] Date of Patent: Jun. 10, 1986

[54] COMBINATION INDEX/GAIN GUIDED SEMICONDUCTOR LASERS

[75] Inventors: Donald R. Scifres, Los Altos; William Streifer; Robert D. Burnham, both of Palo Alto, all of Calif.

[73] Assignee: Xerox Corporation, Stamford, Conn.

[21] Appl. No.: 462,840

[22] Filed: Feb. 1, 1983

[51] Int. Cl.⁴ .............................................. H01S 3/19
[52] U.S. Cl. ..................................... 372/45; 357/17; 372/46; 372/48; 372/50
[58] Field of Search ....................... 372/44, 45, 46, 50, 372/48; 357/17

[56] References Cited

U.S. PATENT DOCUMENTS

| | | | |
|---|---|---|---|
| 4,282,494 | 8/1981 | Yonezu et al. | 372/46 |
| 4,369,513 | 1/1983 | Umeda et al. | 372/46 |
| 4,509,173 | 4/1985 | Umeda et al. | 372/45 |

Primary Examiner—James W. Davie
Attorney, Agent, or Firm—W. Douglas Carothers, Jr.

[57] ABSTRACT

A semiconductor laser characterized by having a combination index and gain guiding region in the optical cavity established between end facets of the laser.

15 Claims, 14 Drawing Figures

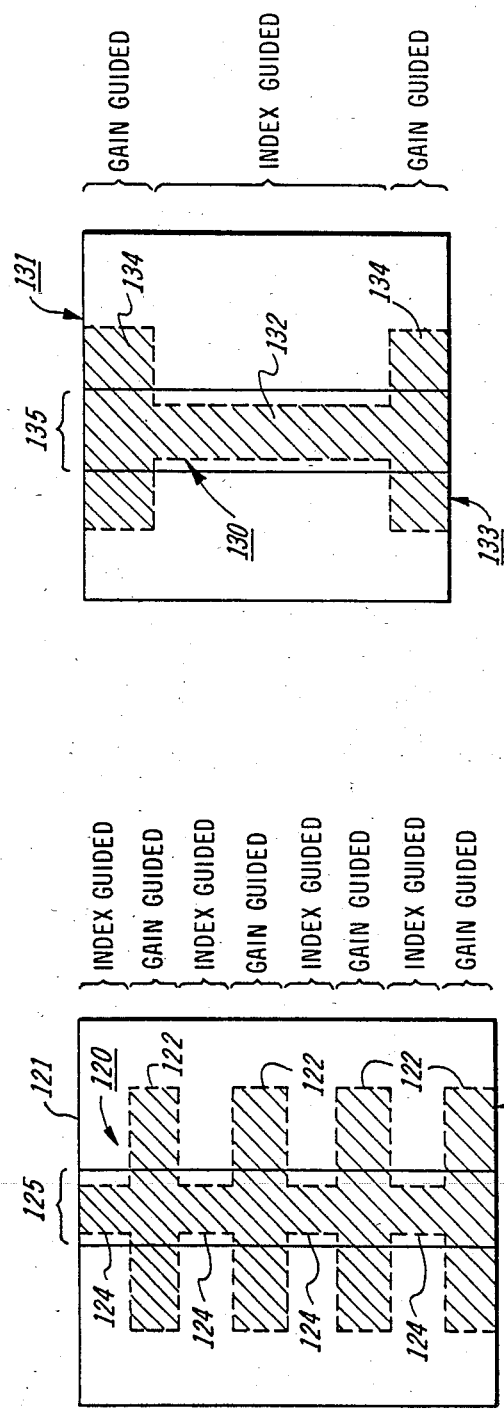

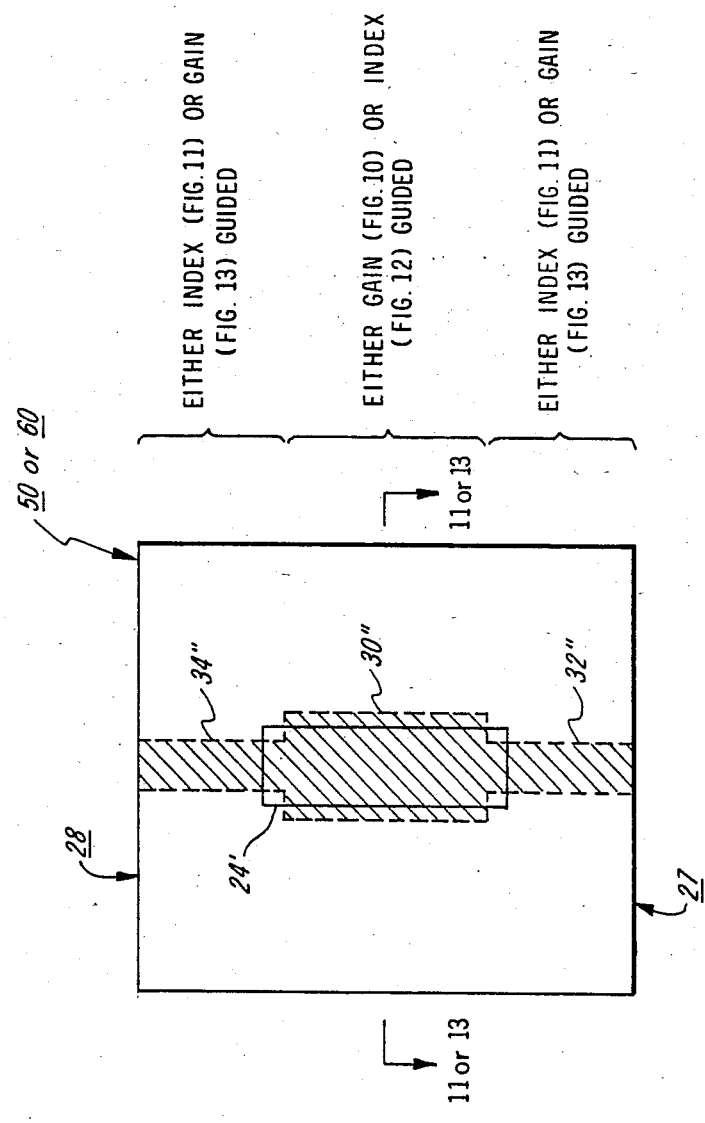

COMBINATION INDEX/GAIN GUIDED SEMICONDUCTOR LASERS

BACKGROUND OF THE INVENTION

This invention relates to semiconductor lasers and, in particular, to lasers having a combination index guiding and gain guiding features.

In conventional semiconductor lasers, the beam emitted from a facet of the laser is usually focused to a small spot in order to meet the needs of various applications, such as optical or magneto-optic disk storage and retrieval and laser printing, by means of reimaging the laser near field pattern to the desired image plane. Semiconductor lasers possess different points of origin of divergence (also referred to as beam waste positions) as well as angles of divergence for radiation emitted from the laser facet in directions orthogonal to each other, i.e., in a vertical emission direction which is perpendicular to the p-n planar junction and in a lateral emission direction which is parallel to and along the p-n planar junction.

These points of origin of divergence also vary relative to different kinds of laser geometry. One kind of laser geometry is the refractive index guiding laser which depends on differences in the index of refraction of materials due to either a diffusion, e.g., Zn, along the plane of the p-n junction to create lateral waveguidance or to the structural geometry of the laser, e.g., nonplanar layers, substrate channels or mesas, or layer thickness variations etc. to guide the propagating radiation by a real refractive index waveguide. In these lasers, the refractive index guiding referred to is along the p-n junction plane, although it need not be precisely at the plane. (It is understood that perpendicular to the plane of the p-n junction the heterostructure layers also create a refractive index waveguide). Examples of these lasers are the channeled substrate planar laser, the channeled substrate nonplanar laser and the buried heterostructure laser. In an index guided laser, the near field pattern of the laser can be imaged into a diffraction limited spot at an image plane with no correction for astigmatism because the beam wastes in both the vertical and lateral directions lie substantially in the plane of the laser facet. These lasers usually emit a narrow wavelength spectrum and often single longitudinal mode operation is obtained.

The other kind of laser geometry is the gain guide laser. A gain guided laser depends upon current dependent differences in both the real and imaginary part of the index of refraction of the semiconductor material comprising the structural layers of the laser to guide the propagating radiation. The narrow current confinement region, or narrow stripe, as the case may be, serves several purposes. Although the threshold current density is somewhat increased in operation of these lasers versus index guided lasers, the total laser threshold current is greatly reduced relative to a wide stripe which adds to minimize internal heating and thereby permitting continuous operation. The current confinement geometry confines the optical wave laterally in the p-n junction where no change in the real part of the refractive index exists in the absence of injected charges. Thus, the high injected charge density and resulting high gain directly beneath the current confining region determines both the real and imaginary parts of the lateral refractive index profile. This lateral waveguiding is totally dependent on the injected charge distribution. As a result, the laser characteristics will depend upon the widths of the current confining region.

As current confinement region widths decrease, power output increases stably (with increasing current) in gain guided lasers and the lateral mode does not shift. This improvement, however, occurs at the expense of an increase in beam divergence along the p-n junction plane and greater beam astigmatism, which is present in all gain guided lasers. Astigmatism occurs because the wavelength curvature of the laser beam is greater for narrower current confinement widths. Since no such curvature occurs perpendicular to the p-n junction plane, the beam waste in the p-n junction plane and in the plane in the laser optical cavity perpendicular to the p-n junction plane are at different spatial positions. Radiation in the vertical emission direction of the laser has a point of origin of divergence or beam waste position well within the laser behind the facet. Because of this factor, the image plane of the beam in the lateral emission direction will not be in the same plane as the vertical emission direction to bring about astigmatism upon focusing to a common image plane requiring more sophisticated optical systems for collimation and refocusing.

In applications such as optical disk systems, printer systems or other such applications requiring focusing of the near field output of a semiconductor laser, it is decidedly advantageous to employ an index guided laser since these lasers do not exhibit the astigmatism of gain guided lasers thereby permitting easily accomplished focusing. However, index guided lasers normally exhibit single longitudinal mode operation when operated at power levels in excess of several milliwatts. In the previously mentioned laser applications, single longitudinal mode operation leads to excess noise resulting from the long coherence length of the laser radiation or longitudinal mode "hopping" caused by thermal variation of the laser versus time. On the other hand, gain guided lasers will provide multilongitudinal mode operation relieving these undesirable effects but requiring a sophisticated lens system to remove the undesirable astigmatism.

SUMMARY OF THE INVENTION

According to this invention, a semiconductor laser is provided with the combination of index/gain guiding attributes to alleviate the foregoing disadvantages. The semiconductor laser is provided with one or more layers forming an active region for supporting radiation propagating under lasing conditions in an optical cavity established between transverse end facets of the laser and the active region is characterized by having a combination index and gain guiding region. For optical disk and other applications previously alluded to, it may be preferred that this combination region, be comprised of a central gain guiding region and an index guiding region between the central gain guiding region and the laser end facets. Furthermore, the regions between the central region and end facets may be provided with sufficiently thin active region thickness to form a synthetic transparent or quantum well waveguide so as not to be radiation absorbing due to the quantization of electron states.

Alternatively, applications may arise wherein an astigmatic output beam emanating from a nearly single longitudinal mode laser may be advantageous leading to a structure with a central index guiding region with index guiding sections adjacent a facet or both adjacent facets.

The index/gain guiding attributes may also be provided in multi-optical cavity laser arrays.

Various other index/gain guiding illustrations are disclosed which are representative of numerous other geometrical configurations that may be derived upon appreciation of the content and understanding of this disclosure.

Further objects and attainments together with a fuller understanding of the invention will become apparent and appreciated by referring to the following description and claims taken in conjunction with the accompanying drawings.

BRIEF DESCRIPTION OF THE DRAWINGS

FIGS. 5-8 show alternative representations of combination index/gain guided lasers with the combination index and gain guiding region illustrative in cross-hatch.

FIG. 5 is a top view illustrative of another combination index/gain guided laser having a different gain guiding attribute.

FIG. 6 is a top view illustrative of a combination index/gain guided laser having a coupled gain guiding and index guiding attribute.

FIG. 7 is a top view illustrative of still another combination index/gain guided laser wherein there is an alternating index guide/gain guiding attribute.

FIG. 8 is a top view illustrative of a further index/gain guided laser having a combination gain/index/gain guiding attribute.

FIG. 9 is a top view of still further combination index/gain guided lasers with the combination index/gain guiding region illustrated in cross-hatch.

DETAILED DESCRIPTION OF THE PREFERRED EMBODIMENTS

Figure 1:
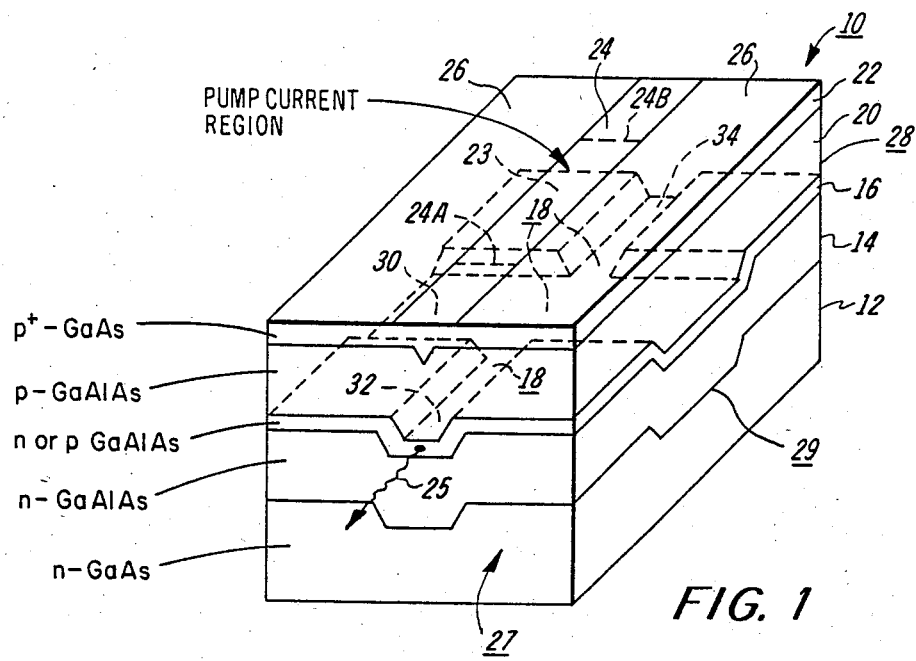
FIG. 1 is a perspective view of an index/gain guided semiconductor laser comprising this invention.

Referring now to FIG. 1, there is shown one embodiment comprising this invention. Semiconductor laser 10 comprises a plurality of consecutively deposited semiconductor layers, for example, of GaAs and GaAlAs of varying doping levels, thicknesses and composition, as is well known in the art. Substrate 12 may be n-GaAs. Cladding layer 14 is n—$Ga_{1-x}Al_xAs$ (e.g., x=0.4), active layer 16 is p, n or undoped $Ga_{1-y}Al_yAs$ (e.g., y=0.05) or GaAs, cladding layer 20 is p—$Ga_{1-x}Al_xAs$ (e.g., x=0.4) and contact layer 22 of p or p+—GaAs. Current combining region 24 through contact or capping layer 22 is a conductive region through which current flows upon application of a metal contact to the exposed surfaces of both the contact layer 22 and the substrate 12 and an applied voltage placed across these contacts, as is well known in the art. Region 24 is formed in semiconductive layer 22 by rendering the surrounding region 26 at least to the depth of that layer insulative by proton or ion implantment, which is known in the art. Other methods for pump current confinement may also be used. Also, the current confinement strip need not extend to the facets 27 and 28 but may be terminated at dotted lines 24A and 24B to confine the current pumping to region 23.

The laser 10 has end facets 27 and 28 from which there is the emission of radiation 25 from what is termed the lasing region 18 of the active layer 16, which region is more particularly defined below.

The substrate 12 is provided with a special geometry which is selectively etched into the substrate prior to epitaxial deposition of layers 14-22, which deposition may be carried out by the conventional epitaxial deposition processes, e.g., LPE, MBE or MO-CVD. This geometry may also be applied after deposition of one or more layers on substrate 12 by selective etch of the deposited layers prior to continued growth including the growth of active layer 16.

The geometry comprises a cross-shaped channel configuration 29 and includes a central channel region of planar extent, best depicted by the outline of the central gain guiding region 30 in active layer 16, and adjacent index guiding regions 32 and 34 between the central gain guiding region 30 and the end facets 27 and 28.

The gain/index combination of regions 30, 32 and 34 form and define the active region 18 and as combined form an optical cavity which provides for multiple longitudinal mode operation because of the gain guide region 30 without astigmatic complications due to the index guiding end regions 32 and 34. A narrow current confinement region 24, e.g., less than 6 μm, will permit the gain guiding region 30 to emit much spontaneous emission and, therefore, multiple longitudinal modes and this gain guiding center region will optically pump broad band radiation into the index guiding regions 32 and 34. Thus, multiple longitudinal mode operation will be achieved concurrently with the ability to provide anastigmatic focusing in the near field emission 25 from the established optical cavity.

Figure 2:
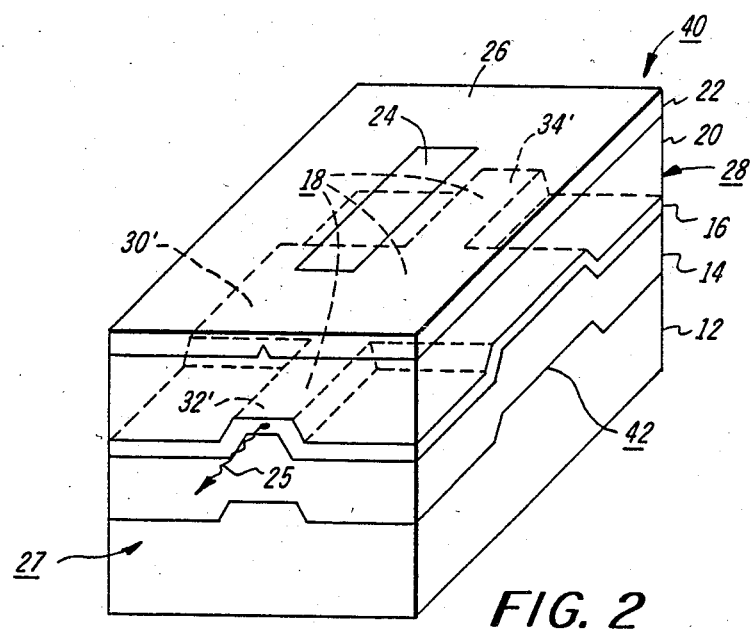
FIG. 2 is a perspective view of another index/gain guided semiconductor laser comprising this invention.

The structure of gain/index guide laser 40 of FIG. 2 is the same as that disclosed in FIG. 1 except that the cross-configuration on substrate 12 is a mesa configuration 42 rather than a channel configuration 29. Therefore, like elements carry the same reference numerals except that the central gain guiding region 30' is on an extended central mesa coupled to the narrow index guiding regions 32' and 34' extending on the same mesa configuration to the end facets 27 and 28. Also, the current confinement region 24 does not extend to the laser facets 27 and 28.

Figure 4:
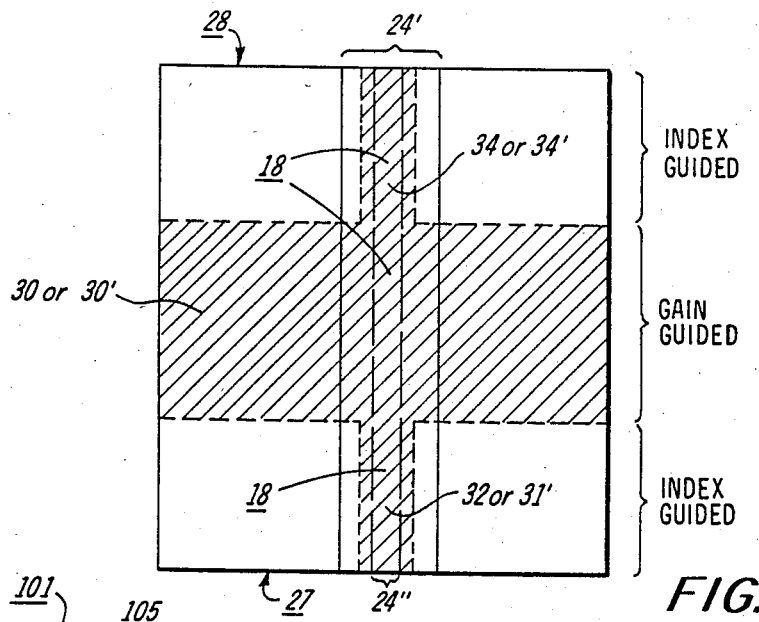
FIG. 4 is a top view illustration representative of the combination index and gain guiding region shown in cross-hatch for either laser shown in FIGS. 1 or 2.

FIG. 4 is a plan illustration of the buried cross-configuration 29 or 42 of FIGS. 1 or 2, respectively shown in cross-hatched within a dotted outline. In this illustration, the current confinement region or strip 24' is shown to extend to the end facets 27 and 28 and is wider than the index guiding geometry in regions 32 or 32' and 34 or 34'. However, the width of the strip geometry may be narrower than the width of index guiding geometry in regions 32 or 32' and 34 or 34' as illustrated by current confinement region or strip 24''. Generally, the gain operation of the index guiding regions does not depend on the width of the current pumping region. However, if the index guiding attributes are quite weak, e.g., a wide channel configuration, then the effective width of the current pumping region can affect optimum gain operation.

It should be understood that the current confinement may extend to the laser facets, in all geometries shown. However, in all geometries shown the current confinement need not extend to the mirrors. This is especially true if the active layer 16 can be made thin enough in the vicinity of the facet mirrors so as to be transparent to the radiation generated in the central region of the laser. For example, the active layer in the index guiding regions 32 or 32' and 34 or 34' may comprise a very thin layer to provide the quantization of electron states so that radiative recombination occurs at a higher energy in this region. Their extreme thinness vis a vis regions 30 or 30' is brought about during the epitaxial growth processing, e.g., MO-CVD. Because the etch channel or mesa, as the case may be, is only a few microns wide in these regions, the crystal growth will be varied in thickness in the channels and mesa regions which is believed primarily due, respectively, to gas restriction in these regions and gas lateral flow enhancement over these reasons in the MO-CVD reactor, vis a vis the wider and more extensive regions 30 and 30'. This causal effect makes it possible to form the quantum well layer or layers in these narrower regions, resulting in transparency to propagating radiation generated in the thicker and wider lasing regions 30 and 30'. The regions 32 and 32', and 34 or 34' function as a partially transparent waveguide, to provide transparent end window regions in the lasers 10 and 40.

Current confinement region 24 may or may not be extended to the end facet 27 and 28. However, in either case, facet degradation may be greatly reduced with concurrently higher outputs being achievable e.g., 3 to 5 times greater optical output. Also, regions 32 or 32' and 34 or 34' being index guiding, the output emission 25 is nonastigmatic due to the two dimensional passive waveguiding in these regions, thereby permitting more easily accomplished focusing of this output for many applications as previously referred to in the Background.

FIG. 9 is an alternative approach to the cross-shaped configuration of FIGS. 1, 2 and 4. Instead of the central lasing region extending to the side edges of the laser structure, this region may be terminated short of the laser side edges.

Figure 10:
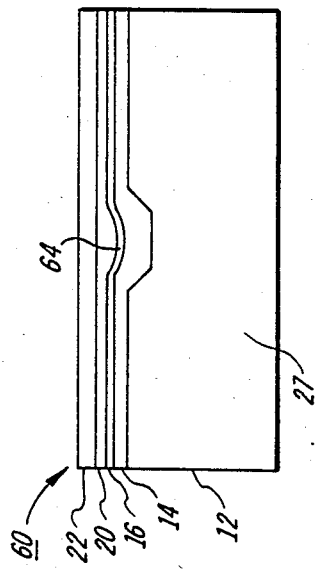
FIGS. 10 and 11 are end and section illustrations, respectively, of one embodiment of an index/gain guiding region for the laser illustration of FIG. 9.
Figure 11:
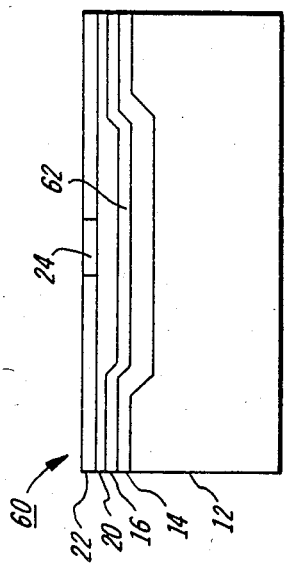

In FIG. 9, the combined lasing regions 30'', 32'' and 34'' of the combination gain/index/gain guided laser 50 may comprise a channel configuration as depicted in FIGS. 10 and 11. The configuration could alternatively be a mesa configuration similar to that shown in FIG. 2. The active central region 30'' in these configurations may be, for example, twice the width of the end regions 32'' and 34''. The channel width in region 30'' is sufficient to permit epitaxial growth to proceed to the active layer 16 with the development of a nonplanar index guiding region 52 shown in FIG. 11. However, in the end guiding regions 32'' and 34'', the channel configuration is sufficiently narrower so that the growth processes proceed to "fill in" the channel and permit the epitaxial growth of the active layer 16 to be planar as illustrated in FIG. 10. In this configuration, the central active region 30'' will be index guided via nonplanar region 52 while the end regions will be gain guided as illustrated in FIG. 10.

Figure 12:
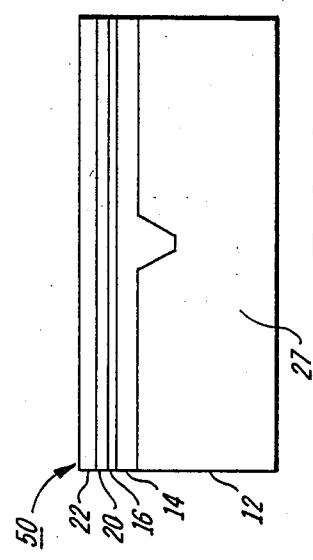
FIGS. 12 and 13 are end and section illustrations, respectively, of another embodiment of an index/gain guiding region for the laser illustration of FIG. 9.
Figure 13:
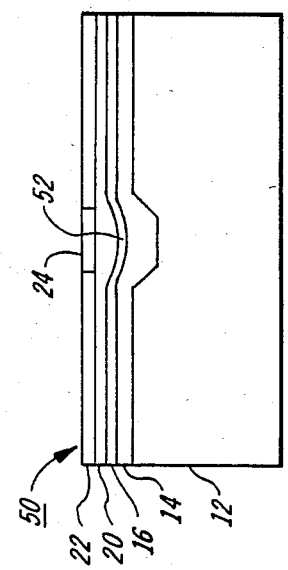

On the other hand, the configuration could be such to form a combination index/gain/index guided laser 60. If central channel region 30'' is sufficiently wide, an extended planar region 62 is formed in the active layer 16 forming a gain guiding region 62 as illustrated in FIG. 13. By the same token, the channel configuration in regions 32'' and 34'' is sufficiently wider so that the growth processes proceed to the active layer 16 with the development of a nonplanar index guiding region 64, similar to the index guiding region 52, as illustrated in FIG. 12.

In either representation for laser 50 or laser 60, the active layer may be a single active layer, or a single quantum well layer or multiple quantum well layers. The quantum well structures may provide the attributes previously mentioned relative to the formation of transparent or passive waveguide active regions over narrowly formed substrate configurations, e.g., channels or mesas.

Figure 3:
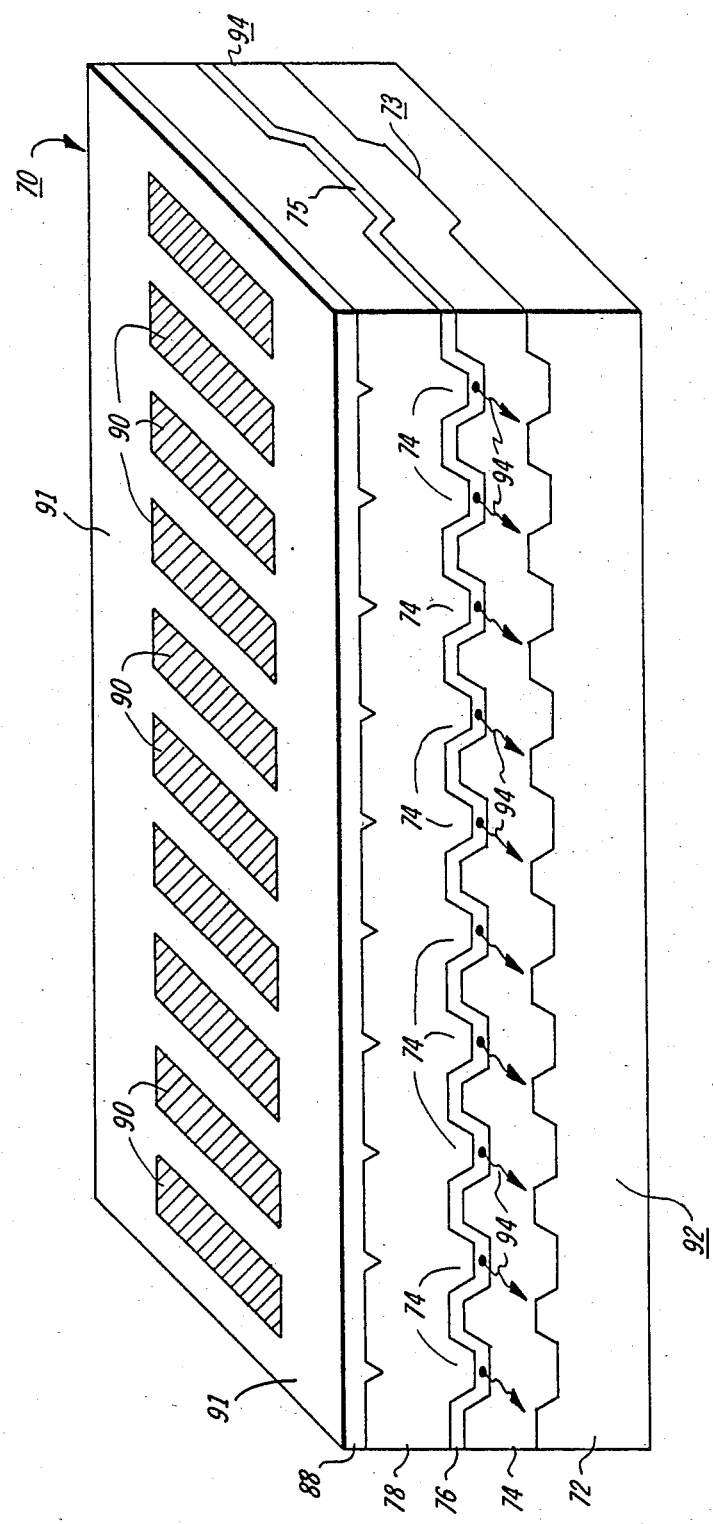
FIG. 3 is a perspective view of an index/gain guided semiconductor laser array comprising this invention.

It should be understood that the combination gain/index guiding configurations disclosed may be extended into multiple laser array configurations. The laser array 70 of FIG. 3 is an example of one such configuration. Array 70 represents an extended multi-laser array of laser 10 shown in FIG. 1. Laser array 70 comprises substrate 72 with cross-shaped configuration 73 similar to the configuration 29 in FIG. 1. Consecutively deposited on substrate 72 are cladding layer 74, active layer, single quantum well layer or multiple quantum well layers 76, cladding layer 78 and contact layer 88. The configuration 73 is provided with a contiguous central gain guiding region 75 that extends transversely through the laser array with a plurality of narrow index guiding regions 77 extending from the central region 75 to either end facet 92 or 94. In this manner, a plurality of optical cavities are formed as represented by the radiation emission outputs 77. Each optical cavity is pumped by means of a corresponding current confinement region 90. Surrounding region 91 of at least the contact layer 88 is rendered insulative by means of selective proton or ion implantment. Also index guiding regions can be formed by means other than those shown, such as Zn diffusion, chemical etching, preferential crystal growth or other means known in the art. The inverse of this structure can also be formed. That is, the central laser region may be index guided with the outer regions in the vicinity of the facet mirrors being gain guided. This configuration allows coupling of the light in the gain guided sections for phase locked operation. By varying the length of the gain guided coupling region single or multilobed phase-locked output beams can be obtained, that is the phase can be controlled.

Typical lengths of the gain guided sections are in the range of 50-100 μm.

Also, it should be evident that the array structure of FIG. 3 may also comprise a multiple emitter structure with each emitter having the the geometry of laser 40 of FIG. 2 wherein the index guiding regions 32' and 34' of each array emitter entails this mesa geometry.

It should be understood that a single or multiple index guiding regions may be provided in the central portion of a single laser array rather than the ends with the ends formed as gain guiding regions. An illustration of a single emitter is shown in the illustration of FIG. 8 wherein the central index guiding region may be a channel or mesa index guiding region and the end regions 134 form gain guiding regions due to their large lateral channel or mesa expanse.

FIGS. 5-8 are illustrative of other combination gain-/index guiding attributes for semiconductor lasers of the present invention. In each of the configurations illustrated, the active region configuration is shown in crosshatch with a dotted outline. The current confinement means is shown in each illustration as extending from facet to facet, although the confinement may be limited to the gain guide region or regions of each illustration in the manner illustrated in FIG. 1, via selective proton or ion implantation or other current confinement means. The configurations in each case may comprise a channel configuration (like FIG. 1) or a mesa configuration (like FIG. 2).

Figure 5:
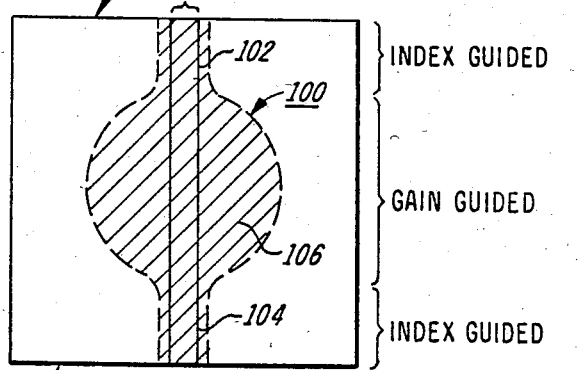

In FIG. 5, the configuration 100 comprises narrow index guiding regions 102 and 104 between the end facets 101 and 103 and a gradually increasing or balloon shaped central gain guiding region 106. The current confinement means 105 may be narrower in width than the width of index guiding regions 102 and 104. It should be noted that the current confinement means may be narrower or wider than the width of the index guiding means in any of the configurations disclosed herein.

Figure 6:
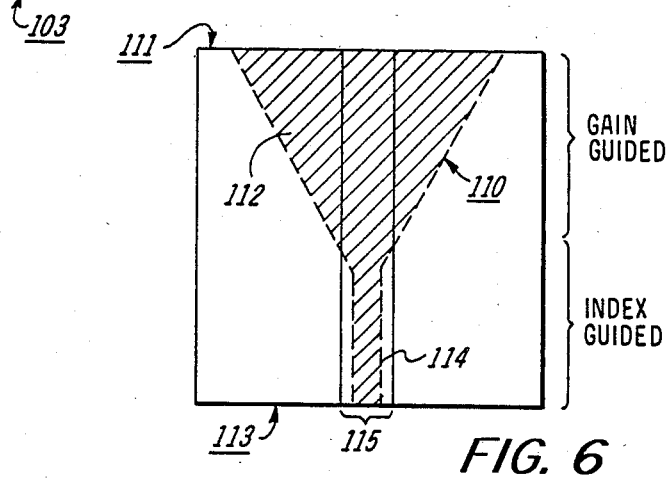

In FIG. 6, the configuration 110 comprises a triangular shaped gain guiding region 112 extending from end facet 111 and coupled to a narrow index guiding active region 114, which extends to end facet 113. The current confinement region 115 is not ably wider than the width of the index guiding active region 114.

In FIG. 7, the configuration 120 comprises a periodic alternating configuration of gain guiding regions 122 and index guiding regions 124. The configuration 120 ends at one facet 123 with a gain guiding region 122 while at the other facet 121 it ends in an index guiding region. However, the configuration could end at both facets with either gain guiding region 122 or index guiding regions 124. The current confinement means 125 is shown to be wider than the width of index guiding regions 124. The current confinement could alternatively comprise a series of current confinement regions, each positioned over a single gain guiding region 124.

In FIG. 8, the configuration 130 comprises a central rectangular index guiding region 132 with wide end gain guiding regions 134 coupled to region 132 and each end facet 131 and 133. The current confinement means 135 is shown to be wider than the width of index guiding region 132.

Although all the foregoing embodiments have been described in connection with semiconductor regimes comprising GaAs and GaAlAs, other light emitting regimes may be employed, such as InGaAsP, GaAlP, GaAlSb, and PbSnTe. Also, although the index guided geometries have been described in terms of channels and mesas, other means for obtaining lateral index guides such as selective diffusion, as in use of a "window stripe" laser, may be used. Also, chemical etching and regrowth, as in the case of a buried heterostructure laser, as well as any other lateral index guiding scheme can be used.

As a specific example, the gain/index guided laser with a thin nonabsorbing mirror region that was grown and processed had the designation MO739B PBB-81. The laser processed had the configuration of laser 40 shown in FIG. 1. Several configurations were fabricated from a single wafer in MO-CVD and consisted of an etched substrate channel patterns with index guiding regions 32 and 34 consecutively having 2, 4, 6 and 8 μm widths. Aligned over each channel combination index guiding regions 32 and 34 were proton implanted strip geometry of consecutively respective widths 4, 6, 9 and 12 μm. Thus, a strip of correspondingly wider width was positioned over a correspondingly narrower channel width. The laser facets 29 were coated with $Al_2O_3$ having a thickness equal to one half of the free space wavelength output of the laser. The laser facet 28 was also coated with a one half wavelength thick $Al_2O_3$ coating followed by a quarter wavelength thick coating of silicon for high reflectivity. Cleaves were made on the processed wafer so that index guiding regions occurred adjacent to the end facets while a gain guiding portion existed in the central gain guiding region. In addition, cleaves were made such that the central region was index guiding and the outer regions adjacent the facet were gain guided. Further, cleaves were made so that one end of the laser was gain guided adjacent the cleaved facet and the other end was index guided adjacent the cleaved facet.

Figure 14:
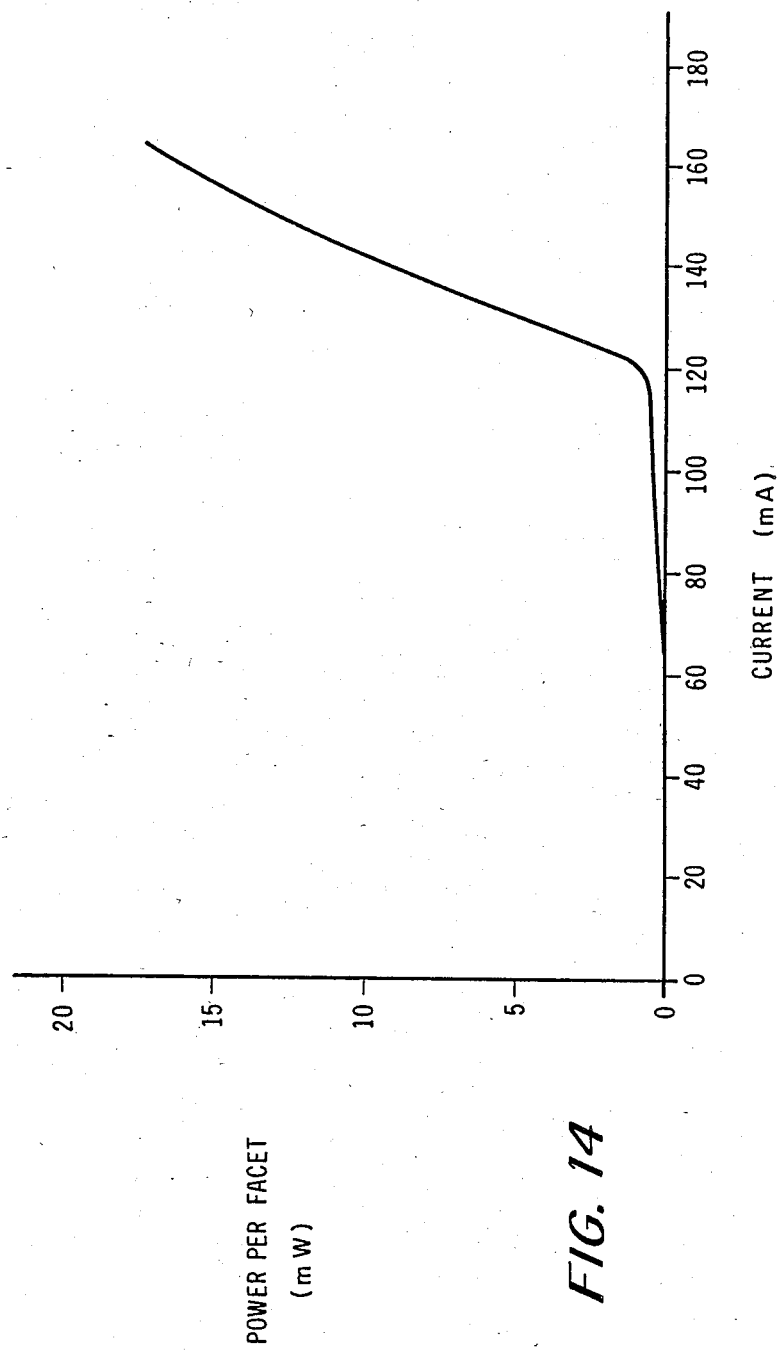
FIG. 14 is a graphic illustration of power versus current characteristics for a semiconductor laser shown in FIG. 1.

An example of the results obtained is illustrated in FIG. 14. The optical output versus current characteristics shown are for an index/gain guide laser 10 of FIG. 1 having 6 μm wide end channels and restricted current confinement region 23. These results also showed stable single lobed far field patterns with no near field astigmatism when the index guiding regions 32 and 34 were adjacent the end facets 27 and 28. In addition, multiple longitudinal modes were observed as in a gain guided laser due to the presence of region 30. Laser thresholds for all lasers were in the range of 90-130 mA. Laser operation was also obtained with the other mirror configurations. Testing for transparency of the thinner active regions near the cleaved facets to the lasing light was also tested by making the contact stripe pattern end prior to the end facet. No Q-switching was observed, as is the case for the results in FIG. 14, due to unpumped regions, these regions thereby indicating improved transparency of the thin regions near the mirror facets.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. In a semiconductor laser comprising a plurality of contiguous semiconductor layers deposited on a substrate, one or more of said layers forming an active region, said active region permitting carrier recombination and light generation in at least one portion thereof and supporting radiation propagating under lasing conditions in an optical cavity established between end facets of the laser, said active region characterized by having in combination at least one index guiding region and at least one gain guiding region integrally coupled to one another relative within said optical cavity.

2. In the semiconductor laser of claim 1 wherein said combination region includes a central gain guiding region and an index guiding region between said central gain guiding region and one or both of said end facets.

3. In the semiconductor laser of claim 1 wherein said combination region includes a central index guiding region and an gain guiding region between said central index guiding region and one or both of said end facets.

4. In the semiconductor laser of claim 1 wherein the regions of said active region are thinner near said end facets so as to function as a partially transparent waveguide for the propagating radiation.

5. In the semiconductor laser of claim 4, means incorporated into said laser to confine current to said combination region substantially in alignment with said optical cavity.

6. In the semiconductor laser of claim 5, wherein said current confinement means does not extend above said transparent waveguide regions.

7. In the semiconductor laser of claim 1, wherein said combination region comprises a plurality of alternating index and gain guide regions between said end facets.

8. In the semiconductor laser of claim 1 wherein there is provided a plurality of spatially parallel optical cavities integral with said substrate to form a plurality of spatially disposed lasers each having said combination index and gain guiding regions.

9. In the semiconductor laser of claim 8 wherein the gain guiding regions of each of said lasers are commonly optically coupled to provide phase locked emissions from said spatially parallel optical cavities.

10. In the semiconductor laser of claim 8 wherein said combination regions each include a common central gain guiding region and spatially disposed index guiding regions between said common central gain guiding region and each of said end facets.

11. In the semiconductor laser of claim 8 wherein said combination regions each include a central index guiding region and a common gain guiding region between said central index guiding region and each of said end facets.

12. In the semiconductor laser of claim 8 wherein the regions of said active region are thinner near said end facets so as to function as a partially transparent waveguide for the propagating radiation.

13. In the semiconductor laser of claim 12, means incorporated into said laser to confine current to each of said combination regions substantially in alignment with each of said optical cavities.

14. In the semiconductor laser of claim 13, wherein said current confinement means does not extend above said transparent waveguide regions.

15. In the semiconductor laser of claim 8, wherein each of said combination regions comprise a plurality of alternating index and gain guiding regions between said end facets.

* * * * *